(12) United States Patent
Aoki et al.

(10) Patent No.: US 10,617,031 B2
(45) Date of Patent: Apr. 7, 2020

(54) ELECTRONIC DEVICE

(71) Applicant: FUJITSU LIMITED, Kawasaki-shi, Kanagawa (JP)

(72) Inventors: Michimasa Aoki, Kawasaki (JP); Masumi Suzuki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/412,474

(22) Filed: May 15, 2019

(65) Prior Publication Data
US 2019/0387641 A1    Dec. 19, 2019

(30) Foreign Application Priority Data
Jun. 13, 2018    (JP) .................... 2018-112889

(51) Int. Cl.
*H05K 7/20* (2006.01)
*F28F 13/00* (2006.01)

(52) U.S. Cl.
CPC ......... *H05K 7/20272* (2013.01); *F28F 13/00* (2013.01); *H05K 7/20163* (2013.01); *H05K 7/20236* (2013.01); *H05K 7/20409* (2013.01)

(58) Field of Classification Search
CPC ........... H05K 7/20272; H05K 7/20163; H05K 7/20236
See application file for complete search history.

(56) References Cited

U.S. PATENT DOCUMENTS

| | | | |
|---|---|---|---|
| 2016/0353609 A1* | 12/2016 | Kakizaki | H01G 2/08 |
| 2017/0064877 A1* | 3/2017 | Ratcliffe | H05K 7/20272 |
| 2017/0311484 A1* | 10/2017 | Ozyalcin | H05K 7/20236 |
| 2018/0020572 A1* | 1/2018 | Fujiwara | H05K 7/203 |
| 2018/0027695 A1* | 1/2018 | Wakino | H05K 7/20236 361/699 |
| 2018/0063991 A1* | 3/2018 | Hirai | F28F 9/0239 |
| 2018/0084671 A1* | 3/2018 | Matsumoto | H05K 7/20236 |
| 2018/0098464 A1* | 4/2018 | Ishinabe | H05K 7/20236 |
| 2018/0246550 A1* | 8/2018 | Inaba | G06F 1/20 |

FOREIGN PATENT DOCUMENTS

| | | |
|---|---|---|
| JP | 2011-518395 | 6/2011 |
| WO | 2009/131810 | 10/2009 |

* cited by examiner

*Primary Examiner* — Hung V Ngo
(74) *Attorney, Agent, or Firm* — Fujitsu Patent Center

(57) ABSTRACT

An electronic device includes a housing filled with a liquid coolant, a first electronic device accommodated in the housing and immersed in the liquid coolant, a first heat sink provided with the first electronic device and exposed to the liquid coolant filled in the housing, a suction pipe configured to have an inlet that sucks the liquid coolant filled in the housing, a discharge pipe configured to have an outlet that faces the first heat sink via the liquid coolant filled in the housing and discharges the liquid coolant sucked from the inlet toward the first heat sink, and a pump provided in the housing to be coupled between the suction pipe and the discharge pipe, and configured to suck the liquid coolant from the inlet and discharge the liquid coolant from the outlet.

12 Claims, 8 Drawing Sheets

US 10,617,031 B2

ELECTRONIC DEVICE

CROSS-REFERENCE TO RELATED APPLICATION

This application is based upon and claims the benefit of priority of the prior Japanese Patent Application No. 2018-112889, filed on Jun. 13, 2018, the entire contents of which are incorporated herein by reference.

FIELD

The embodiments discussed herein are related to an electronic device.

BACKGROUND

As a method of cooling an electronic component, a liquid immersion cooling method has been known, in which an electronic component is immersed and cooled in a liquid coolant filled in a housing. For example, an electronic device has been known, in which an electronic component having a heat sink covered with a cover unit is immersed in a liquid coolant and the coolant is introduced into the cover unit from an inflow pipe connected to the cover unit (e.g., Japanese National Publication of International Patent Application No. 2011-518395).

Related techniques are disclosed in, for example, Japanese National Publication of International Patent Application No. 2011-518395.

SUMMARY

According to an aspect of the embodiments, an electronic device includes a housing filled with a liquid coolant, a first electronic device accommodated in the housing and immersed in the liquid coolant, a first heat sink provided with the first electronic device and exposed to the liquid coolant filled in the housing, a suction pipe configured to have an inlet that sucks the liquid coolant filled in the housing, a discharge pipe configured to have an outlet that faces the first heat sink via the liquid coolant filled in the housing and discharges the liquid coolant sucked from the inlet toward the first heat sink, and a pump provided in the housing to be coupled between the suction pipe and the discharge pipe, and configured to suck the liquid coolant from the inlet and discharge the liquid coolant from the outlet.

The object and advantages of the disclosure will be realized and attained by means of the elements and combinations particularly pointed out in the claims.

It is to be understood that both the foregoing general description and the following detailed description are exemplary and explanatory and are not restirctive of the disclosure, as claimed.

DESCRIPTION OF EMBODIMENTS

In the electronic device described above, since the coolant flows around the heat sink by introducing the coolant into the cover unit from the inflow pipe, it is possible to efficiently cool the electronic component. However, there is still room for an improvement in the cooling of an electronic component.

Hereinafter, embodiments of the present disclosure will be described with reference to the drawings.

First Embodiment

Figure 1:
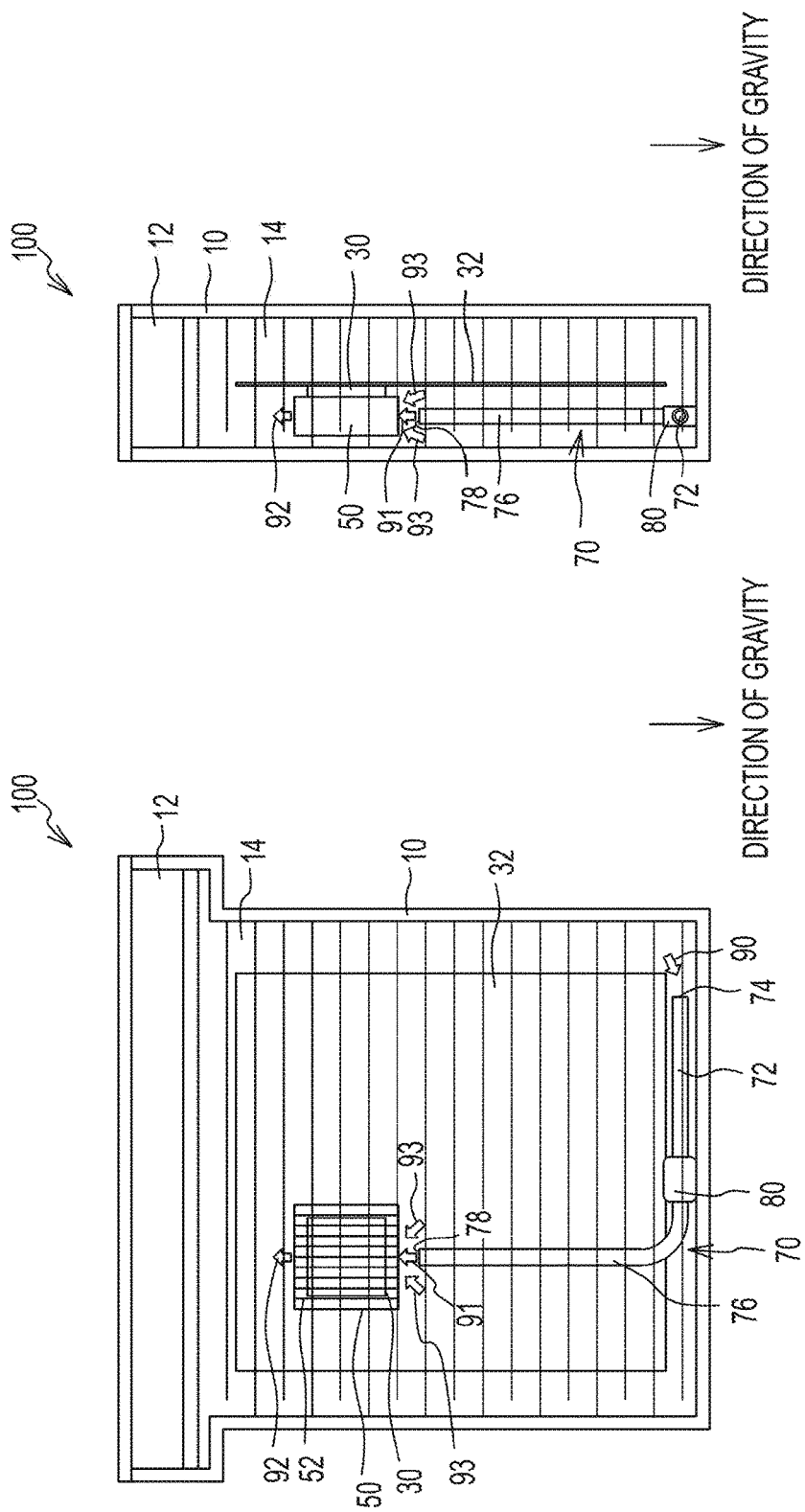
FIGS. 1A and 1B are respectively a perspective front view and a perspective side view of an electronic device according to a first embodiment.

FIGS. 1A and 1B are respectively a perspective front view and a perspective side view of an electronic device according to a first embodiment. As illustrated in FIGS. 1A and 1B, the electronic device 100 of the first embodiment includes a housing 10, an electronic component 30, a heat sink 50, and a coolant supply unit 70.

The housing 10 has a space 12 therein. A liquid coolant 14 is filled in the space 12 to be stored therein. The coolant 14 has electrical insulation and thermal conductivity. The coolant 14 is, for example, a fluorine-based insulating coolant such as a fluorocarbon-based cooling liquid. The housing 10 is formed of a material having a high thermal conductivity such as a metal. The housing 10 is formed of, for example, stainless steel or aluminum. In addition, the housing 10 may be formed of a material other than a metal such as, for example, plastic.

The electronic component 30 is mounted on a wiring board (circuit board) 32. The wiring board 32 on which the electronic component 30 is mounted stands upright in the direction of gravity and is accommodated in the housing 10. The wiring board 32 is immersed in the coolant 14 in the housing 10. Since the coolant 14 has electrical insulation, the wiring board 32 on which the electronic component 30 is mounted may be immersed in and cooled by the coolant 14. The electronic component 30 is, for example, a central processing unit (CPU), but may be any other electronic component that generates heat. The wiring board 32 is, for example, a printed circuit board, but may be any other wiring board.

The heat sink 50 includes a plurality of heat radiation fins 52 and is provided on the main surface of the electronic component 30. The heat radiation fins 52 are exposed to the coolant 14 in the housing 10 while being exposed in the housing 10. That is, the heat radiation fins 52 are not covered with a cover unit. The heat sink 50 is formed of a material having a high thermal conductivity such as metal. The heat sink 50 is formed of, for example, aluminum. Since the heat sink 50 is provided on the electronic component 30 and thus, the heat radiation area of the electronic component 30 is increased, the electronic component 30 is effectively cooled.

The coolant supply unit 70 is accommodated in the housing 10 and is immersed in the coolant 14 in the housing 10. The coolant supply unit 70 includes a suction pipe 72 having a suction port (an inlet) 74, a discharge pipe 76 having a discharge port (an outlet) 78, and a pump 80 connected between the suction pipe 72 and the discharge pipe 76 to suck the coolant 14 from the suction port 74 and discharge the coolant 14 from the discharge port 78. The suction pipe 72, the discharge pipe 76, and the pump 80 are accommodated in the housing 10 and are immersed in the coolant 14 in the housing 10. The suction pipe 72 and the discharge pipe 76 are formed of a metal material such as, for example, aluminum, but may be formed of an insulating material such as rubber or resin. The suction pipe 72 is connected to a suction port of the pump 80 and the discharge pipe 76 is connected to a discharge port of the pump 80. The pump 80 is disposed, for example, on the bottom portion of the housing 10 on the lower side of the direction of gravity.

The suction pipe 72 extends in parallel to the bottom surface of the housing 10 from the pump 80 disposed on the bottom portion of the housing 10. Thus, the suction port 74 is provided on the bottom portion of the housing 10 and is provided on the lower side than the electronic component 30 in the direction of gravity. When the pump 80 is driven, the suction port 74 sucks the coolant 14 existing in the vicinity of the bottom portion of the housing 10, in other words, the coolant 14 existing on the lower side than the electronic component 30 in the direction of gravity. In addition, the phrase "in parallel to the bottom surface of the housing 10" is not limited to a case of parallel in a strict sense but may include, for example, a slight inclination.

The discharge pipe 76 is bent upward in the direction of gravity from the pump 80 disposed on the bottom portion of the housing 10 and extends to a position in front of the heat sink 50. Thus, the discharge port 78 faces the heat radiation fins 52 of the heat sink 50 from the lower side of the direction of gravity via the coolant 14 in the housing 10 therebetween. Since the heat sink 50 is not covered with a cover unit but is exposed inside the housing 10, a gap between the discharge port 78 and the entire surface of the heat sink 50 facing the discharge port 78 is filled with the coolant 14 so that no member other than the coolant 14 is provided. When the pump 80 is driven, the discharge port 78 discharges the coolant 14 sucked in at the suction port 74 from the lower side of the direction of gravity toward the heat radiation fins 52. The heat radiation fins 52 linearly extend in a direction in which the coolant 14 is discharged from the discharge port 78, i.e., in the direction of gravity.

Here, the effects of the electronic device according to the first embodiment will be described with reference to FIGS. 1A and 1B. As indicated by the arrow 90 in FIG. 1A, when the pump 80 is driven, the coolant 14 in the housing 10 is sucked from the suction port 74. The coolant 14 sucked in at the suction port 74 is discharged from the discharge port 78 toward the heat radiation fins 52 of the heat sink 50 as indicated by the arrow 91 in FIGS. 1A and 1B. The coolant 14 discharged from the discharge port 78 flows between the heat radiation fins 52 as indicated by the arrow 92 in FIGS. 1A and 1B. In this manner, since the coolant 14 flows at a high flow velocity between the heat radiation fins 52, the electronic component 30 may be effectively cooled. In addition, the heat sink 50 having the heat radiation fins 52 is exposed to the coolant 14 in the housing 10 while being exposed in the housing 10. Therefore, when the coolant 14 is discharged from the discharge port 78, as illustrated by the arrow 93 in FIGS. 1A and 1B, the coolant 14 existing in the housing 10 around the discharge port 78 is caught in the discharge flow of the coolant 14 from the discharge port 78 and is introduced into the heat radiation fins 52. Thus, in addition to the coolant 14 discharged from the discharge port 78, the coolant 14 existing around the discharge port 78 flows between the heat radiation fins 52. Thus, since the flow rate of the coolant 14 flowing between the heat radiation fins 52 is increased, the electronic component 30 may be effectively cooled. In addition, by sucking the coolant 14 in the housing 10 from the suction port 74 and discharging the coolant 14 from the discharge port 78, the coolant 14 in the housing 10 circulates and a difference in the temperature of the coolant 14 in the housing 10 is reduced. Therefore, the cooling of the coolant 14 is effectively performed by a heat exchange with the outside via a sidewall of the housing 10. Therefore, it is possible to effectively cool the electronic component 30.

According to the first embodiment, the electronic component 30 is provided with the heat sink 50 including the heat radiation fins 52 exposed to the coolant 14 while being exposed in the housing 10 and filled in the housing 10. The coolant supply unit 70 is provided in the housing 10 and is immersed in the coolant 14. The coolant supply unit 70 includes the suction pipe 72 having the suction port 74, the discharge pipe 76 having the discharge port 78, and the pump 80 connected between the suction pipe 72 and the discharge pipe 76 and provided in the housing 10. The suction port 74 sucks the coolant 14 filled in the housing 10. The discharge port 78 faces the heat radiation fins 52 via the coolant 14 filled in the housing 10 therebetween, and discharges the coolant 14 sucked in at the suction port 74 toward the heat radiation fins 52. The pump 80 sucks the coolant 14 from the suction port 74 and discharges the coolant 14 from the discharge port 78. Thus, as described above, the coolant 14 discharged from the discharge port 78 and the coolant 14 existing around the discharge port 78 flow between the heat radiation fins 52. That is, the amount of coolant 14 which is equal to or greater than the amount of coolant discharged from the discharge port 78 flows between the heat radiation fins 52 at a high flow velocity. In addition, since the coolant 14 in the housing 10 circulates to reduce a difference in the temperature thereof, cooling of the coolant 14 is effectively performed by a heat exchange with the outside of the housing 10. Thus, the cooling performance of the electronic component 30 may be improved. In addition, since the pump 80 is provided in the housing 10, it is possible to shorten the lengths of the suction pipe 72 and the discharge pipe 76, as compared with a case where the pump 80 is provided outside the housing 10. Thus, it is possible to discharge the coolant 14 sucked in at the suction port 74 from the discharge port 78 toward the heat radiation fins 52 while reducing the loss of pressure in the suction pipe 72 and the discharge pipe 76.

In addition, due to a configuration in which the coolant 14 sucked in at the suction port 74 is discharged from the discharge port 78 toward the heat radiation fins 52, it is possible to reduce the load of the pump 80, as compared with a case where the coolant 14 sucked in at the suction port 74 flows in a spatial flow path provided inside the heat sink 50. Thus, it is possible to increase the amount of discharge of the coolant 14 from the discharge port 78 or to miniaturize and save energy of the electronic device 100 by using the small pump 80.

As illustrated in FIG. 1A, the suction port 74 of the coolant supply unit 70 may be provided on the bottom portion of the housing 10 on the lower side of the direction of gravity. The coolant 14 warmed by the electronic component 30 flows upward in the direction of gravity, and the coolant 14 cooled by a heat exchange with the outside via the sidewall of the housing 10 flows downward to the lower side of the direction of gravity. Thus, by providing the suction port 74 on the bottom portion of the housing 10, it is possible to suck the low temperature coolant 14 from the suction port 74 and discharge the coolant 14 from the discharge port 78 toward the heat radiation fins 52. This makes it possible to effectively cool the electronic component 30. In addition, since the coolant 14 warmed by the electronic component 30 flows upward in the direction of gravity with respect to the electronic component 30, in order to prevent the coolant 14 warmed by the electronic component 30 from being sucked in at the suction port 74, the suction port 74 may be located on the lower side than the electronic component 30 in the direction of gravity.

As illustrated in FIG. 1A, when the suction port 74 of the coolant supply unit 70 is provided on the bottom portion of the cabinet 10 on the lower side of the direction of gravity, the discharge port 78 of the coolant supply unit 70 may be provided on the lower side than the electronic component 30 in the direction of gravity to discharge the coolant 14 toward the heat radiation fins 52 from the lower side of the direction of gravity. Thus, it is possible to efficiently circulate the coolant 14 in the housing 10.

Second Embodiment

Figure 2:
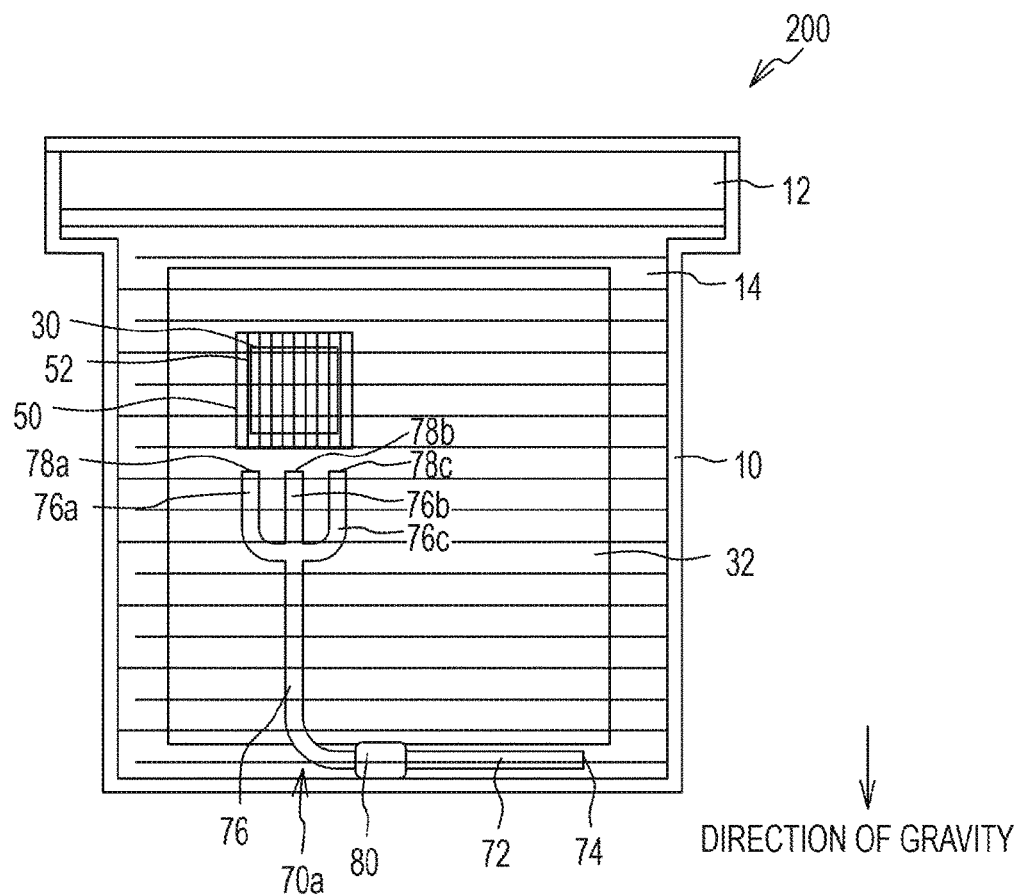
FIG. 2 is a perspective front view of an electronic device according to a second embodiment.

FIG. 2 is a perspective front view of an electronic device according to a second embodiment. As illustrated in FIG. 2, in the electronic device 200 of the second embodiment aspect, a coolant supply unit 70a has a plurality of discharge ports 78a to 78c by dividing the middle of the discharge pipe 76 into a plurality of (e.g., three) discharge pipes 76a to 76c. The plurality of discharge ports 78a to 78c are arranged side by side from one end side to the other end side of the heat sink 50. The coolant 14 sucked in at the suction port 74 is discharged from the respective discharge ports 78a to 78c toward the heat radiation fins 52. The other configuration is the same as in the first embodiment and thus, a description thereof will be omitted.

According to the second embodiment, the coolant supply unit 70a has the plurality of discharge ports 78a to 78c arranged side by side from one end side to the other end side of the heat sink 50. Thus, since the coolant 14 is discharged from the respective discharge ports 78a to 78c to the heat radiation fins 52 over the entire heat sink 50, it is possible to effectively cool the electronic component 30.

Third Embodiment

Figure 3:
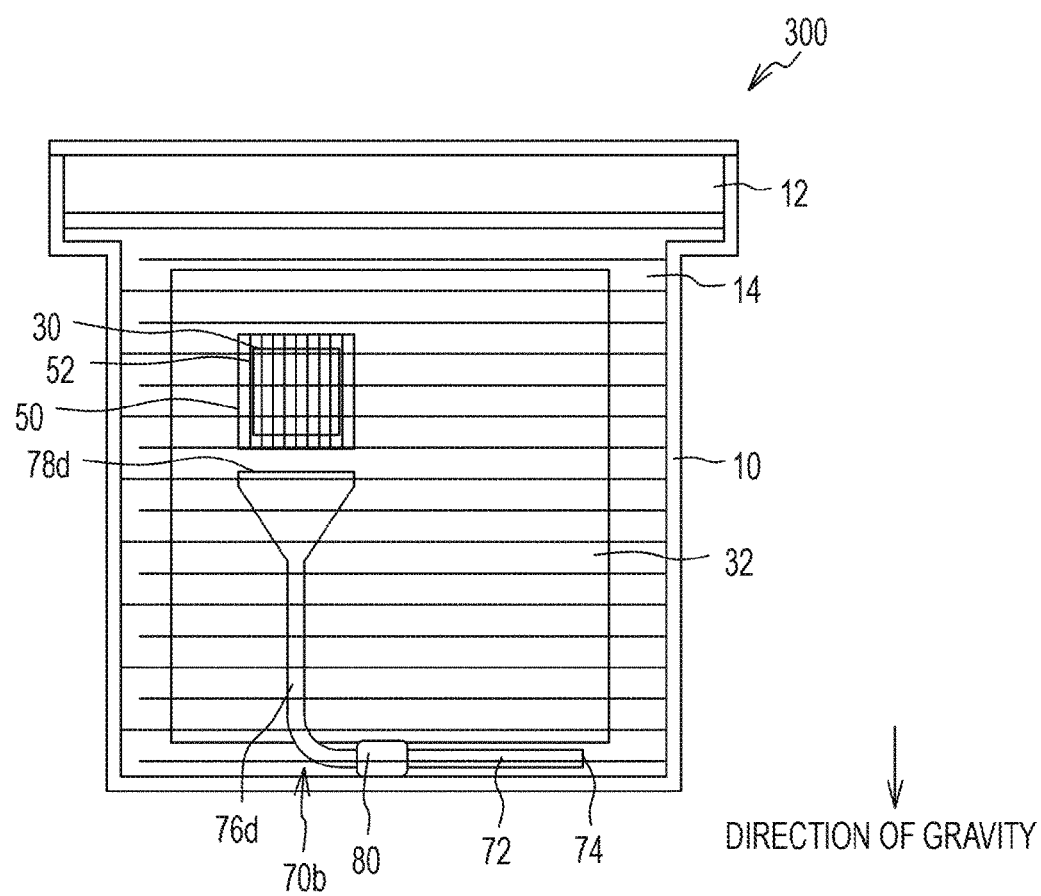
FIG. 3 is a perspective front view of an electronic device according to a third embodiment.

FIG. 3 is a perspective front view of an electronic device according to a third embodiment. As illustrated in FIG. 3, in the electronic device 300 of the third embodiment, a discharge pipe 76d of a coolant supply unit 70b has a tapered width in the middle thereof, so that a discharge port 78d has a flat shape having the same width as the heat sink 50. In addition, "the same width" is not limited to a case of the same size in a strict sense but also includes a slightly different case. The other configuration is the same as in the first embodiment and thus, a description thereof will be omitted.

According to the third embodiment, the coolant supply unit 70b has one discharge port 78d of a flat shape extending from one end side to the other end side of the heat sink 50. Thus, since the coolant 14 is discharged from the discharge port 78d to the heat radiation fins 52 over the entire heat sink 50, it is possible to effectively cool the electronic component 30.

Fourth Embodiment

Figure 4A:
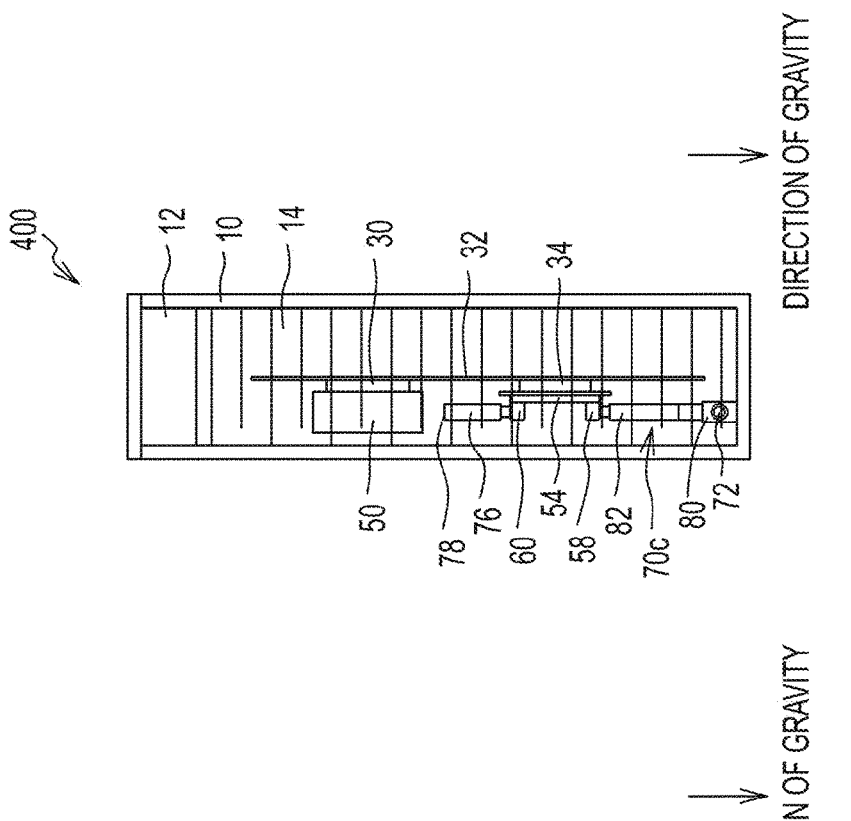
FIGS. 4A and 4B are respectively a perspective front view and a perspective side view of an electronic device according to a fourth embodiment.
Figure 4B:
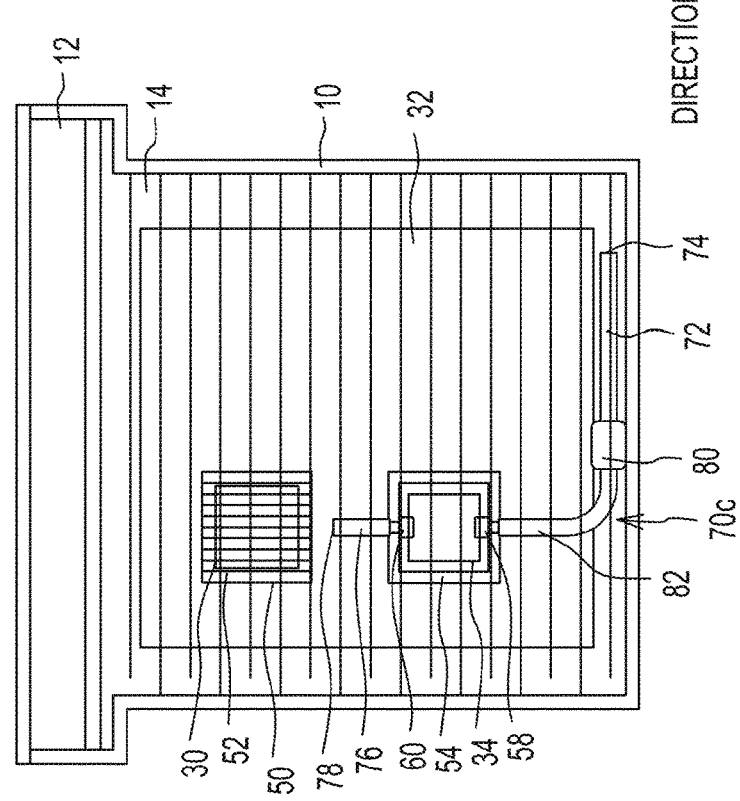
Figure 5:
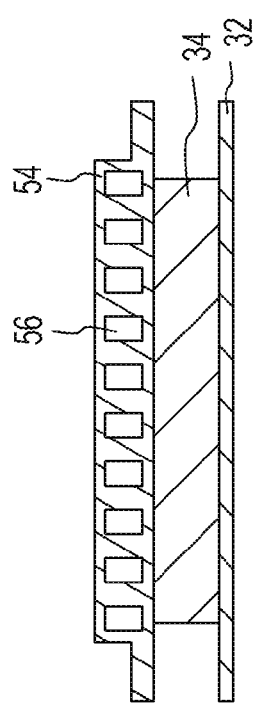
FIG. 5 is an enlarged cross-sectional view of a portion of the electronic device according to the fourth embodiment.

FIGS. 4A and 4B are respectively a perspective front view and a perspective side view of an electronic device according to a fourth embodiment. FIG. 5 is an enlarged cross-sectional view of a portion of the electronic device according to the fourth embodiment. As illustrated in FIGS. 4A, 4B, and 5, in the electronic device 400 of the fourth embodiment, an electronic component 34 is mounted on the wiring board 32 in addition to the electronic component 30. That is, the electronic components 30 and 34 are accommodated in the housing 10 and are immersed in the coolant 14 in the housing 10. The electronic component 34 is, for example, a CPU, but may be any other electronic component that generates heat.

A heat sink 54 is provided on the main surface of the electronic component 34. The heat sink 54 is formed of a material having a high thermal conductivity such as metal. The heat sink 54 is formed of, for example, aluminum. The heat sink 54 has therein a plurality of spaces 56 extending along the main surface of the electronic component 34. One end side of the plurality of spaces 56 is connected to one inlet 58 and the other end side is connected to one outlet 60. The plurality of spaces 56 are connected in parallel between the inlet 58 and the outlet 60.

A coolant supply unit 70c includes a connection pipe 82 in addition to the suction pipe 72 having the suction port 74, the discharge pipe 76 having the discharge port 78, and the pump 80. The suction pipe 72 having the suction port 74 is connected to the suction port of the pump 80 in the same manner as in the first embodiment. One end side of the connection pipe 82 is connected to the discharge port of the pump 80 and the other end side is connected to the inlet 58 of the heat sink 54. The discharge pipe 76 having the discharge port 78 is connected to the outlet 60 of the heat sink 54. Thus, the coolant 14 sucked in at the suction port 74 passes through the connection pipe 82 and the spaces 56 in the heat sink 54 and is discharged from the discharge port 78 toward the heat radiation fins 52 of the heat sink 50. The other configuration is the same as in the first embodiment and thus, a description thereof will be omitted.

According to the fourth embodiment, the spaces 56 through which the coolant 14 sucked in at the suction port 74 flows are provided in the heat sink 54 which is provided on the electronic component 34 immersed in the coolant 14. The coolant supply unit 70c discharges the coolant 14 sucked in at the suction port 74 through the spaces 56 in the heat sink 54 and then from the discharge port 78 toward the heat radiation fins 52 of the heat sink 50. Therefore, it is possible to cool both of the electronic components 30 and 34, and it is possible to efficiently cool a plurality of the electronic components 30 and 34.

One space 56 having a large flow path cross-sectional area may be connected between the inlet 58 and the outlet 60 of the heat sink 54, but as illustrated in FIG. 5, the plurality of spaces 56 having a small flow path cross-sectional area may be connected in parallel. Thus, the coolant 14 may flow uniformly throughout the heat sink 54.

In addition, although the fourth embodiment illustrates a case where the heat sink 54 is provided with no heat radiation fin by way of example, the heat sink 54 may be provided with a plurality of heat radiation fins in the same manner as the heat sink 50.

Fifth Embodiment

Figure 6:
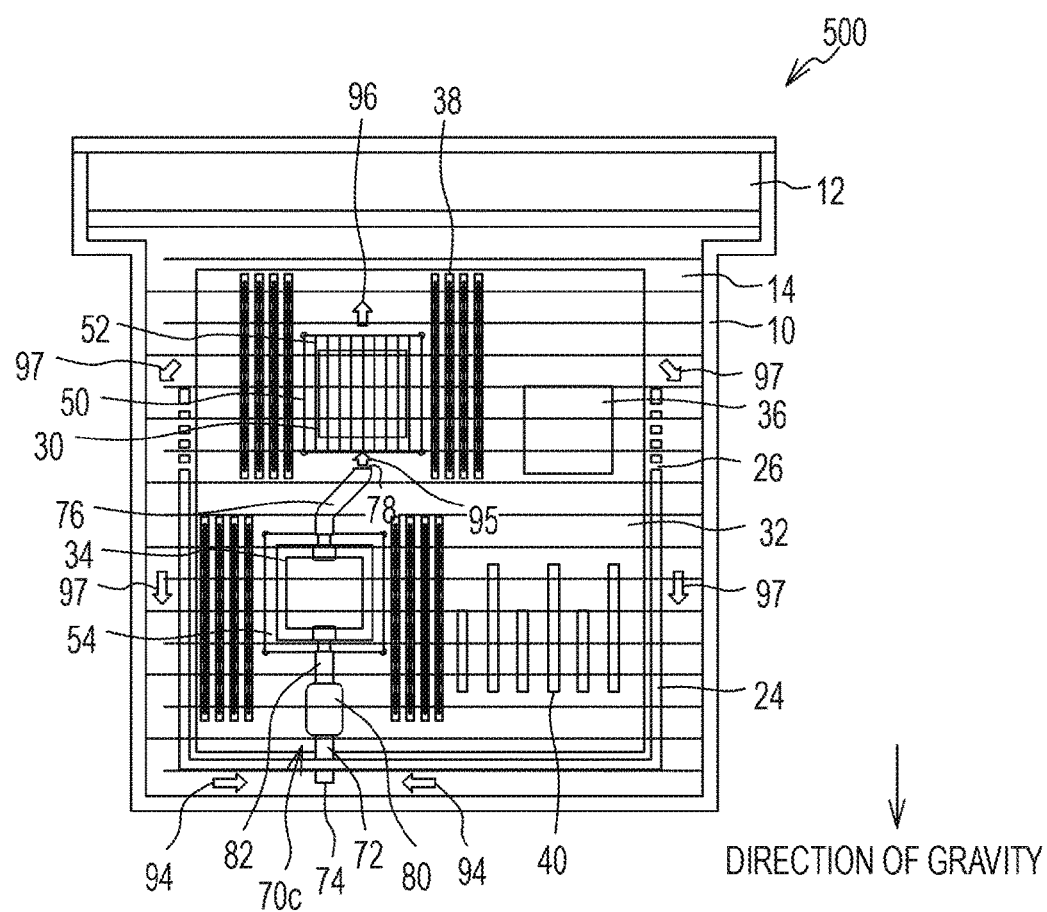
FIG. 6 is a perspective front view of an electronic device according to a fifth embodiment.

FIG. 6 is a perspective front view of an electronic device according to a fifth embodiment. As illustrated in FIG. 6, in the electronic device 500 of the fifth embodiment, in addition to the electronic component 30 provided with the heat sink 50 on the main surface of the wiring board 32, the electronic component 34 provided with the heat sink 54 and electronic components 36, 38 and 40 are mounted on the main surface of the wiring board 32. The electronic components 30, 34 and 36 are, for example, CPUs, and the electronic components 38 and 40 are, for example, memories. The coolant supply unit 70c which includes the suction pipe 72 having the suction port 74, the discharge pipe 76 having the discharge port 78, the pump 80, and the connection pipe 82 is provided in the housing 10.

A guide unit 24 which extends along the side surface and the bottom surface of the housing 10 and is immersed in the coolant 14 is provided in the housing 10. The guide unit 24 extends, for example, along the bottom surface of the housing 10 and along the side surface of the housing 10 from the bottom surface side beyond the center in the height direction of the side surface. A gap in which the coolant 14 exists is formed between the guide unit 24 and the side surface and the bottom surface of the housing 10. The wiring board 32 is provided inside the guide unit 24, i.e., on the side of the guide unit 24 opposite to the side surface and the bottom surface of the housing 10. An opening 26 is provided in a portion of the guide unit 24. For example, the guide unit 24 has a plurality of openings 26 in a portion thereof facing the electronic component 36.

The suction port 74 of the coolant supply unit 70c is located between the guide unit 24 and the bottom surface of the housing 10. Thus, the suction port 74 sucks the coolant 14 existing between the guide unit 24 and the bottom surface of the housing 10. The coolant 14 sucked in at the suction port 74 is discharged through the connection pipe 82 and the spaces 56 (not illustrated in FIG. 6) formed in the heat sink 54 and then from the discharge port 78 toward the heat radiation fins 52 of the heat sink 50. The other configuration is the same as in the first embodiment and thus, a description thereof will be omitted.

According to the fifth embodiment, the guide unit 24 is provided in the housing 10 which extends along the inner surface of the housing 10. The suction port 74 of the coolant supply unit 70c is located between the guide unit 24 and the inner surface of the housing 10. Thus, as indicated by the arrow 94 in FIG. 6, when the pump 80 is driven, the coolant 14 existing between the guide unit 24 and the inner surface of the housing 10 is sucked from the suction port 74. The coolant 14 sucked in at the suction port 74 passes through the connection pipe 82 and the spaces 56 formed in the heat sink 54, and thereafter, is discharged from the discharge port 78 toward the heat radiation fins 52 of the heat sink 50 as indicated by an arrow 95 in FIG. 6. The coolant 14 discharged from the discharge port 78 flows between the heat radiation fins 52 as indicated by the arrow 96 in FIG. 6. Thereafter, as indicated by the arrow 97 in FIG. 6, the coolant 14 flows toward the suction port 74 between the guide unit 24 and the inner surface of the housing 10. In this way, by providing the guide unit 24 and positioning the suction port 74 between the guide unit 24 and the inner surface of the housing 10, it is possible to establish the flow through which the coolant 14 that has passed through the heat radiation fins 52 passes between the guide unit 24 and the inner surface of the housing 10 and reaches the suction port 74. The coolant 14 flowing between the guide unit 24 and the inner surface of the housing 10 is easily cooled since it is easily subjected to a heat exchange with the outside of the housing 10. Thus, since the relatively low temperature coolant 14 may be sucked from the suction port 74, it is possible to effectively cool the electronic components 30 and 34.

As illustrated in FIG. 6, the opening 26 may be provided in a portion of the guide unit 24. The opening 26 may be provided adjacent to an electronic component such as the electronic component 36 that generates heat. Providing the opening 26 in the guide unit 24 generates the flow through which the coolant 14 passes through the opening 26. Thus, by providing the opening 26 adjacent to the electronic component 36, it is possible to generate the flow through which the coolant 14 passes through the electronic component 36, and it is possible to effectively cool the electronic component 36.

Sixth Embodiment

Figure 7:
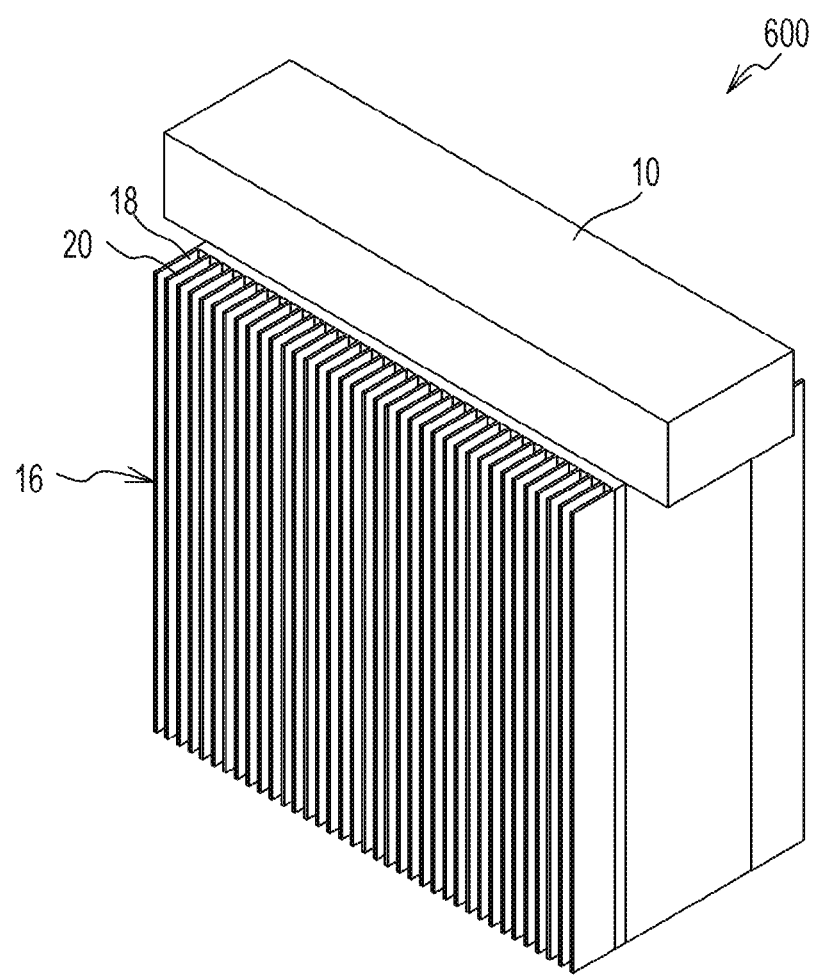
FIG. 7 is a perspective view of an electronic device according to a sixth embodiment.

FIG. 7 is a perspective view of an electronic device according to a sixth embodiment. As illustrated in FIG. 7, in the electronic device 600 of the sixth embodiment, a concavo-convex portion 16 is provided on the outer surface of the housing 10. That is, the concavo-convex portion 16 in which concave portions 18 and convex portions 20 extending in the same direction are repeatedly provided is provided on the outer surface of the housing 10. The concavo-convex portion 16 is formed of a material having high thermal conductivity such as a metal. The concavo-convex portion 16 may be formed of the same metal material (e.g., stainless steel) as the housing 10, or may be formed of a different metal material (e.g., aluminum or copper). The other configuration is the same as in the first embodiment and thus a description thereof will be omitted.

According to the sixth embodiment, by providing the concavo-convex portion 16 on the outer surface of the housing 10, it is possible to effectively cool the coolant 14 in the housing 10 by heat exchange with the outside of the housing 10.

Seventh Embodiment

Figure 8:
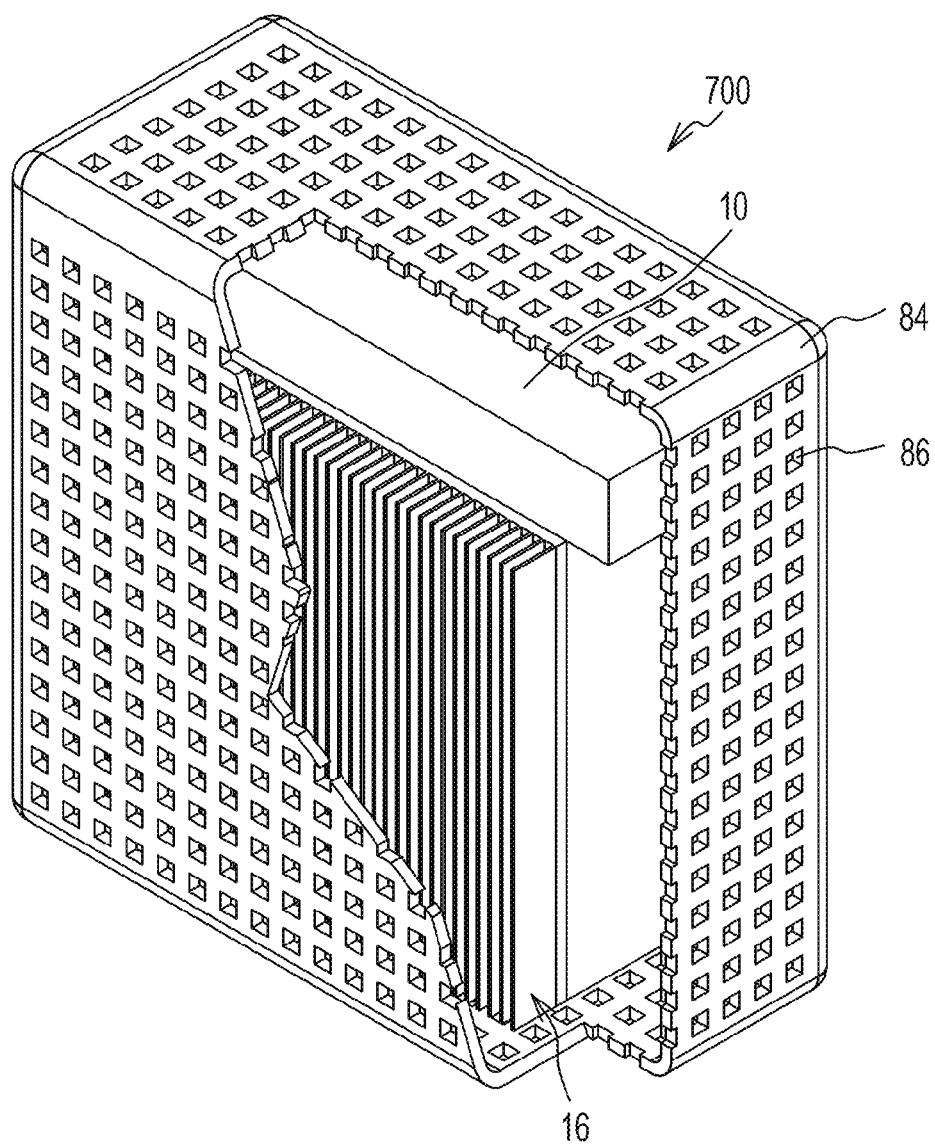
FIG. 8 is a perspective view of an electronic device according to a seventh embodiment.

FIG. 8 is a perspective view of an electronic device according to a seventh embodiment. In addition, FIG. 8 illustrates the housing 10 in a state where a portion of a cover unit 84 is omitted. As illustrated in FIG. 8, in the electronic device 700 of the seventh embodiment, the concavo-convex portion 16 is provided on the outer surface of the housing 10 in the same manner as the electronic device 600 of the sixth embodiment. In addition, the cover unit 84 is provided so as to cover the housing 10. The cover unit 84 is formed of a material having a thermal conductivity lower than that of the concavo-convex portion 16, and is formed of, for example, plastic. The cover unit 84 is provided with a plurality of through-holes 86. Thus, air may flow through the through-holes 86 between the inside and the outside of the cover unit 84. The other configuration is the same as in the first embodiment and thus, a description thereof will be omitted.

According to the seventh embodiment, the cover unit 84 is provided to cover the housing 10. Thus, even when the housing 10 is heated to a high temperature by the generation of heat in the electronic component 30, it is possible to prevent a user from touching the high-temperature housing 10. In addition, since air may flow through the through-holes 86 between the inside and the outside of the cover unit 84 through the provision of the through-holes 86 in the cover unit 84, it is possible to cool the coolant 14 in the housing 10 by a heat exchange with the outside of the housing 10.

In addition, the seventh embodiment illustrates a case where the concavo-convex portion 16 is provided on the outer surface of the housing 10 by way of example, the concavo-convex portion 16 may not be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
   a housing filled with a liquid coolant;
   a first electronic component accommodated in the housing and immersed in the liquid coolant;
   a first heat sink provided with the first electronic component and exposed to the liquid coolant filled in the housing;
   a suction pipe configured to have an inlet that sucks the liquid coolant filled in the housing;
   a discharge pipe configured to have an outlet that faces the first heat sink via the liquid coolant filled in the housing and discharges the liquid coolant sucked from the inlet toward the first heat sink; and
   a pump provided in the housing to be coupled between the suction pipe and the discharge pipe, and configured to suck the liquid coolant from the inlet and discharge the liquid coolant from the outlet.

2. The electronic device according to claim 1, wherein the inlet is provided over a bottom located at a low side of a direction of gravity of the housing.

3. The electronic device according to claim 2, wherein the outlet is provided over a lower side than the first electronic component in the direction of gravity and configured to discharge the liquid coolant toward the first heat sink from the low side of the direction of gravity.

4. The electronic device according to claim 1, further comprising:
   a guide provided in the housing along an inside surface of the housing,
   wherein the inlet is provided between the guide and the inside surface of the housing.

5. The electronic device according to claim 4, wherein the guide is configured to have an opening at a position adjacent to a second electronic component.

6. The electronic device according to claim 5, further comprising:
   a third electronic component accommodated in the housing and immersed in the liquid coolant; and
   a second heat sink provided over the third electronic component and configured to have a space in which the liquid coolant sucked at the inlet flows,
   wherein the liquid coolant sucked at the inlet is discharged from the outlet toward the first heat sink after passing through the space of the second heat sink.

7. The electronic device according to claim 6, wherein the second heat sink is configured to have a plurality of spaces arranged in parallel.

8. The electronic device according to claim 1, further comprising a plurality of outlets arranged side by side from a first side to a second side of the first heat sink.

9. The electronic device according to claim 1, further comprising an outlet having a flat shape and configured to extend from a first side to a second side of the first heat sink.

10. The electronic device according to claim 1, wherein the housing is configured to have a concavo-convex portion over an outside surface of the housing.

11. The electronic device according to claim 1, further comprising a cover configured to cover the housing and have a through-hole.

12. The electronic device according to claim 1, wherein the first heat sink extends in a direction where the liquid coolant is discharged from the outlet.

* * * * *